United States Patent
Choi et al.

(10) Patent No.: US 10,396,128 B2
(45) Date of Patent: Aug. 27, 2019

(54) ANTI-REFLECTIVE OPTICAL FILM AND BENDABLE DISPLAY APPARATUS INCLUDING THE OPTICAL FILM

(71) Applicant: SAMSUNG DISPLAY CO., LTD., Yongin-si, Gyeonggi-Do (KR)

(72) Inventors: Dongwook Choi, Yongin-si (KR); Taeeun Kim, Yongin-si (KR); Heeyoung Lee, Yongin-si (KR); Dukjin Lee, Yongin-si (KR); Woosuk Jung, Yongin-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 39 days.

(21) Appl. No.: 15/410,072

(22) Filed: Jan. 19, 2017

(65) Prior Publication Data

US 2017/0278902 A1    Sep. 28, 2017

(30) Foreign Application Priority Data

Mar. 24, 2016  (KR) .................. 10-2016-0035545

(51) Int. Cl.
*H01L 27/32*    (2006.01)
*H01L 51/50*    (2006.01)
(Continued)

(52) U.S. Cl.
CPC .......... *H01L 27/3211* (2013.01); *G02B 1/08* (2013.01); *G02B 1/11* (2013.01); *G02B 5/3016* (2013.01); *G02B 5/3083* (2013.01); *H01L 27/3246* (2013.01); *H01L 51/0097* (2013.01); *H01L 51/5253* (2013.01); *H01L 51/5281* (2013.01); *H01L 27/3244* (2013.01); *H01L 51/508* (2013.01); *H01L 51/5064* (2013.01); *H01L 51/5088* (2013.01); *H01L 51/5092* (2013.01); *H01L 2251/5338* (2013.01); *Y02E 10/549* (2013.01)

(58) Field of Classification Search
CPC ............ H01L 27/3211; H01L 27/3246; H01L 51/0097; H01L 51/5088; G02B 5/3016; G02B 1/11; G02B 1/08
USPC ......................... 257/40, 59, 72; 438/48, 82
See application file for complete search history.

(56) References Cited

U.S. PATENT DOCUMENTS 5,061,042 A * 10/1991 Nakamura ........... G02B 5/3083
                                                  349/102
5,187,603 A *  2/1993 Bos .................... G02F 1/13363
                                                  349/102
(Continued)

FOREIGN PATENT DOCUMENTS

JP    2014-071380    4/2014
KR    10-2004-0099140    11/2004
(Continued)

*Primary Examiner* — Thinh T Nguyen
(74) *Attorney, Agent, or Firm* — F. Chau & Associates, LLC (57) ABSTRACT

A display apparatus includes a display panel configured to display an image. The display panel has a folding axis extending in a first direction. An optical film is disposed over the display panel. The optical film includes a circular polarizer including at least two phase retarders and one polarizer. Slow axes of each of the at least two phase retarders are located in the same quadrant of four quadrants of the optical film.

20 Claims, 10 Drawing Sheets

(51) Int. Cl.
*G02B 1/08* (2006.01)
*G02B 1/11* (2015.01)
*G02B 5/30* (2006.01)
*H01L 51/00* (2006.01)
*H01L 51/52* (2006.01)

(56) References Cited

U.S. PATENT DOCUMENTS 7,495,382 B2　2/2009　Yamazaki et al.
8,344,396 B2　1/2013　Shim et al.

FOREIGN PATENT DOCUMENTS

KR　10-2012-0015942　2/2012
KR　10-2013-0000310　1/2013

\* cited by examiner

ANTI-REFLECTIVE OPTICAL FILM AND BENDABLE DISPLAY APPARATUS INCLUDING THE OPTICAL FILM

CROSS REFERENCE TO RELATED APPLICATION

This application claims priority to, and the benefit of, Korean Patent Application No. 10-2016-0035545, filed on Mar. 24, 2016, in the Korean Intellectual Property Office, the disclosure of which is incorporated by reference herein in its entirety.

TECHNICAL FIELD

Exemplary embodiments of the present invention relate to an anti-reflective optical film, and more particularly, to an anti-reflective optical film capable of preventing or reducing a color change during bending or folding of a display apparatus, and the bendable/foldable display apparatus including the optical film.

DISCUSSION OF THE RELATED ART

A display apparatus generally includes a display device for displaying an image. The display device may include various elements that are disposed on a substrate. Some modern display devices may be bendable or foldable in at least a portion thereof. Such display devices may be curved in different ways so as to contribute to a display apparatus that has a contoured surface that may be viewed from various angles.

Furthermore, the display apparatus may include an optical film for limiting reflection of external, ambient light. The optical film may therefore increase the visibility and contrast of the display apparatus by reducing glare thereon.

However, in the related art, as the display device bends, the optical film will also be bent. This bending of the optical film may give rise to a tensile force or a compressive force within the optical film. The tensile force or the compressive force may change a direction of a slow axis of a phase retarder included in the optical film, causing a change in a color of an image produced by the display apparatus. Thus, the image quality of the displayed image may suffer at the bent portions of the display apparatus.

SUMMARY

One or more exemplary embodiments of the present invention include an optical film capable of preventing or reducing a color change attributable to a bending or folding of a display apparatus. One or more exemplary embodiments of the present invention include a display apparatus using the optical film.

According to one or more exemplary embodiments of the present invention, a display apparatus includes a display panel configured to display an image. The display panel has a folding axis extending in a first direction. An optical film is disposed over the display panel. The optical film includes a circular polarizer including at least two phase retarders and one polarizer. Slow axes of each of the at least two phase retarders are located in a same quadrant of four quadrants of the optical film.

The four quadrants of the optical film are delineated by the folding axis and a virtual axis extending in a second direction perpendicular to the first direction. The four quadrants may be substantially equal in area.

The at least two phase retarders may include a quarter wave ($\lambda/4$) phase retarder and a half wave ($\lambda/2$) phase retarder.

The circular polarizer may include the $\lambda/4$ phase retarder, the $\lambda/2$ phase retarder, and the polarizer, which are sequentially disposed over the display panel.

The slow axis of the $\lambda/4$ phase retarder and the slow axis of the $\lambda/2$ phase retarder may form an angle of about 55 degrees to about 65 degrees with respect to each other.

The $\lambda/4$ phase retarder and the $\lambda/2$ phase retarder may each include reactive liquid crystals.

The $\lambda/4$ phase retarder may include nematic liquid crystals, and the $\lambda/2$ phase retarder may include discotic or nematic liquid crystals.

An absorption, axis of the polarizer may be located in a same quadrant of the four quadrants of the optical film as the slow axes of each of the at least two phase retarders.

The display panel may include a flexible substrate and an organic light-emitting device disposed over the flexible substrate. The organic light-emitting device includes a pixel electrode, an opposite electrode, and an intermediate layer disposed between the pixel electrode and the opposite electrode. The intermediate layer includes an organic light-emitting layer.

The display panel may further include a protection film that is disposed below the flexible substrate. An encapsulating layer may be disposed over the flexible substrate and may cover the organic light-emitting device. The encapsulating layer may include at least one inorganic encapsulating layer and at least one organic encapsulating layer.

A slow axis of the $\lambda/4$ phase retarder and the folding axis may form a first angle of about 62.5 degrees to about 72.5 degrees with respect to each other. A slow axis of the $\lambda/2$ phase retarder and the folding axis may form a second angle of about 2.5 degrees to about 12.5 degrees with respect to each other.

Each of the first and second angles may be measured counterclockwise with respect to the folding axis.

An absorption axis of the polarizer and the folding axis may form a third angle of about 75 degrees to about 85 degrees with respect to each other.

A slow axis of the $\lambda/4$ phase retarder and the folding axis may form a first angle of about 152.5 degrees to about 162.5 degrees with respect to each other. A slow axis of the $\lambda/2$ phase retarder and the folding axis may form a second angle of about 92.5 degrees to about 102.5 degrees with respect to each other. Each of the first and second angles may be measured counterclockwise with respect to the folding axis An absorption axis of the polarizer and the folding axis may form a third angle of about 165 degrees to about 175 degrees with respect to each other.

The optical film may further include a first adhesion layer that is disposed between the $\lambda/4$ phase retarder and the $\lambda/2$ phase retarder. A second adhesion layer is disposed between the $\lambda/2$ phase retarder and the polarizer.

The at least two phase retarders may further include an additional half wave ($\lambda/2$) phase retarder.

According to one or more exemplary embodiments of the present invention, an optical film includes a protection layer having a folding axis that extends in a first direction. A circular polarizer is disposed over the protection layer. The circular polarizer includes at least two phase retarders and one polarizer. Slow axes of each of the at least two phase retarders are located in a same quadrant of four quadrants of the optical film.

The four quadrants of the optical film may be delineated by the folding axis and a virtual axis extending in a second direction perpendicular to the first direction. The four quadrants may be substantially equal in area.

The circular polarizer may include the at least two phase retarders including a quarter wave (λ/4) phase retarder and a half wave (λ/2) phase retarder, which are sequentially disposed over a display panel. A polarizer is disposed over the at least two phase retarders.

The slow axis of the λ/4 phase retarder and the slow axis of the λ/2 phase retarder may form an angle of about 55 degrees to about 65 degrees with respect to each other.

The λ/4 phase retarder and the λ/2 phase retarder may each include reactive liquid crystals.

The λ/4 phase retarder may include nematic liquid crystals, and the λ/2 phase retarder may include discotic or nematic liquid crystals.

An absorption axis of the polarizer may be located in a same quadrant of the four quadrants of the optical film as the slow axes of each of the at least two phase retarders. The optical film may further include a first adhesion layer disposed between the λ/4 phase retarder and the λ/2 phase retarder and a second adhesion layer disposed between the λ/2 phase retarder and the polarizer.

A flexible display apparatus includes a flexible display panel and an optical film disposed on the flexible display panel. Me optical, film includes a first phase retarder and a second phase retarder. A slow axis of the first phase retarder is aligned with a slow axis of the second phase retarder.

Alignment of the slow axis of the second phase retarder with the slow axis of the first phase retarder may include disposing the second phase retarder such that an angle between the slow axis of the first phase retarder and the slow axis of the second phase retarder is within a range of between 55 and 65 degrees.

Alignment of the slow axis of the second phase retarder with the slow axis of the first phase retarder may include disposing the second phase retarder such that the slow axis of the first phase retarder and the slow axis of the second phase retarder are located within a same quadrant of four quadrants of the optical film that are defined by a folding axis of the optical film and a perpendicular axis that is perpendicular to the folding axis.

The first phase retarder may be a half wave phase retarder, the second phase retarder may be a quarter wave phase retarder, and the optical film may additionally include a polarizer.

The alignment of the slow axis of the second phase retarder with the slow axis of the first phase retarder may include disposing the second phase retarder such that as the flexible display apparatus bends, a disposition of the slow axis of the first phase retarder relative to a disposition of the slow axis of the second phase retarder remains unchanged.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Hereinafter, exemplary embodiments of the present invention will be described in detail with reference to the accompanying drawings. Like reference numerals may be assigned to like elements throughout the drawings and the specification.

Sizes of elements in the drawings may be exaggerated for convenience of explanation and for added clarity. The present invention is not necessarily limited to the sizes and thickness of the various elements of the exemplary embodiments of the present invention illustrated in the figures and described herein.

In the following examples, the x-axis, the y-axis and the z-axis are not limited to three axes of the rectangular coordinate system, and may be interpreted in a broader sense. For example, the x-axis, the y-axis, and the z-axis need not be orthogonal to one another.

Hereinafter, exemplary embodiments of the present invention will be described in detail with reference to the accompanying drawings.

Figure 1:
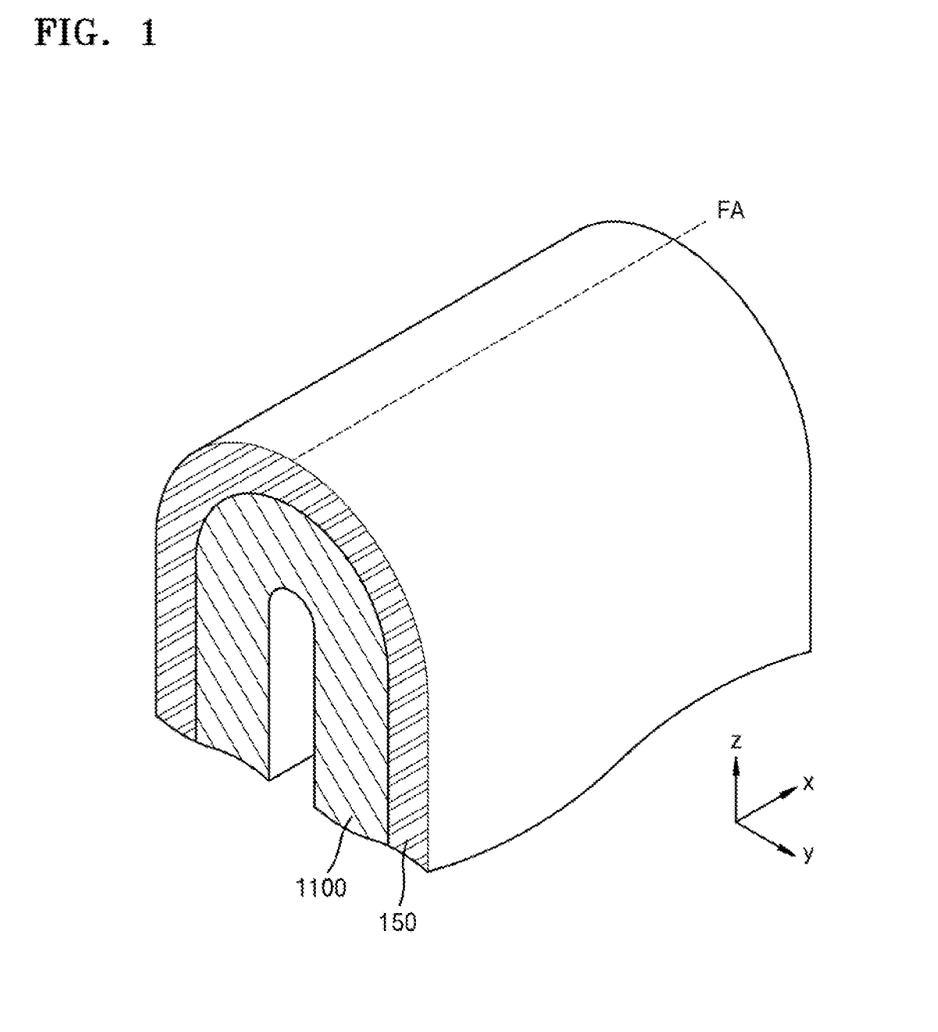
FIG. 1 is a schematic perspective view of a display apparatus according to an exemplary embodiment of the present invention.
Figure 2:
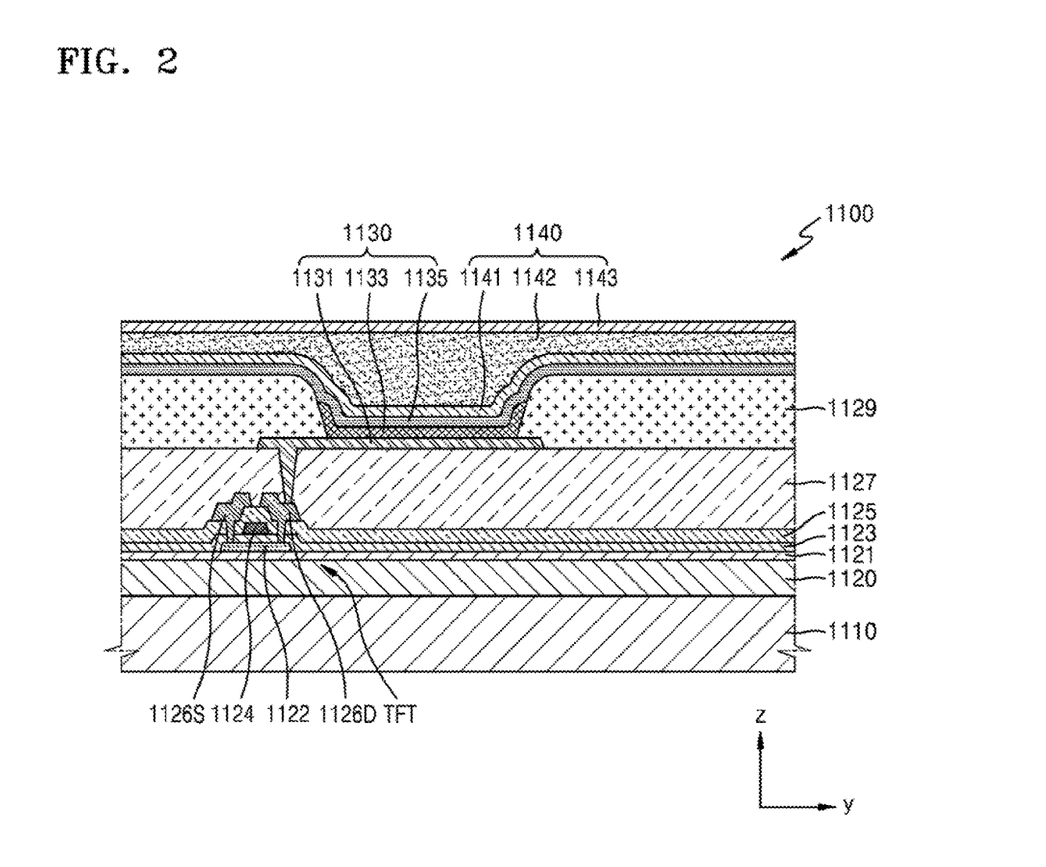
FIG. 2 is a schematic cross-sectional view of a display panel included in the display apparatus of FIG. 1.
Figure 3:
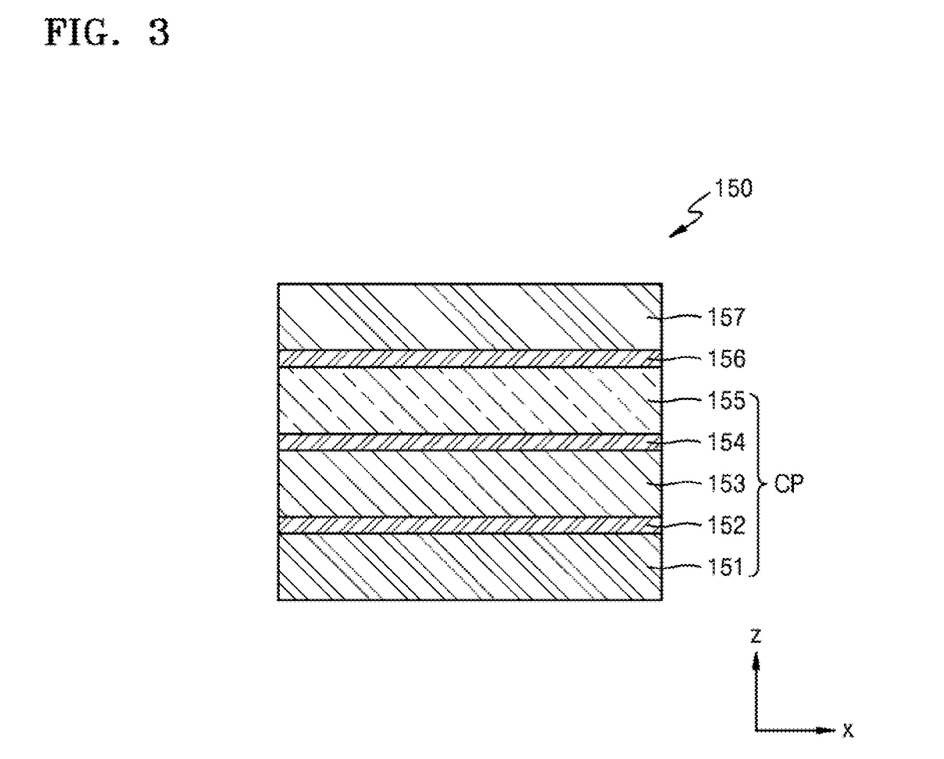
FIG. 3 is a schematic cross-sectional view of an optical film included in the display apparatus of FIG. 1.
Figure 4:
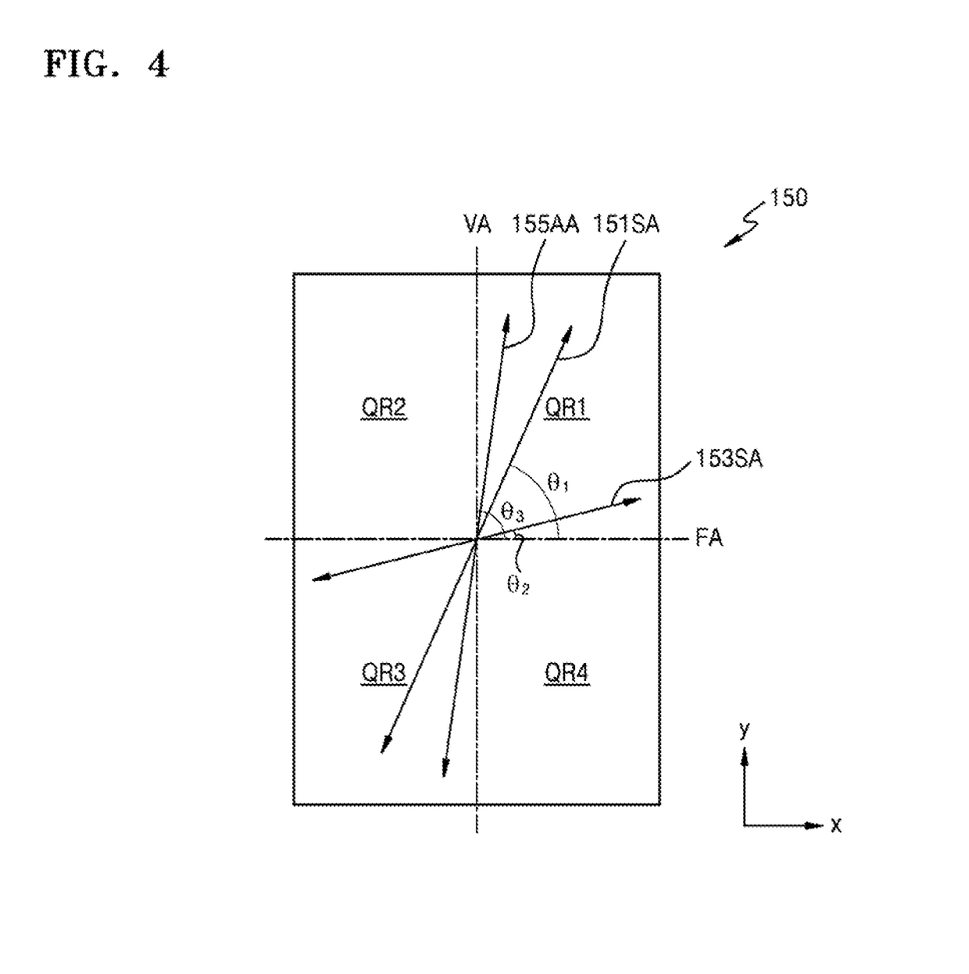
FIG. 4 is a conceptual diagram of slow axes of phase retarders and an absorption axis of a polarizer in the optical film of FIG. 3.

FIG. 1 is a schematic perspective view of a display apparatus according to an exemplary embodiment of the present invention. FIG. 2 is a schematic cross-sectional view of a display panel 1100 included in the display apparatus of FIG. 1. FIG. 3 is a schematic cross-sectional view of an optical film 150 included in the display apparatus of FIG. 1. FIG. 4 is a conceptual diagram of slow axes of phase retarders 151 and 153 and an absorption axis of a polarizer 155 in the optical film 150 of FIG. 3. For convenience, the display apparatus is illustrated in FIGS. 2 to 4 as being in an unbent or unfolded state, although, it is to be understood that the display apparatus may be bent, for example, as shown in FIG. 1.

Referring to FIGS. 1 to 4, the display apparatus according to an exemplary embodiment of the present invention may include the display panel 1100 and the optical film 150. The display panel 1100 may display an image and may have a folding axis FA extending in a first direction (e.g. x-axis). The optical film 150 may include a circular polarizer (CP) that is disposed over the display panel 1100 and includes at least two phase retarders 151 and 153 and one polarizer 155.

While the display apparatus is illustrated in FIG. 1 as being in a folded state, the display apparatus need not always maintain the folded state in use and the display apparatus may be bent and straightened as desired. For example, the display apparatus may include a bendable or foldable display apparatus. However, exemplary embodiments are not limited to this arrangement. For example, the display apparatus may be permanently arranged in a bended or folded state.

The display apparatus may have the folding ads FA extending in the first direction (e.g., x-axis) and may be foldable about the folding axis FA. When the display panel 1100 is folded, the optical film 150 that is disposed over the display panel 1100 may also be folded.

As may be seen in FIG. 2, the display panel 1100 may include a substrate 1120 and an organic light-emitting device 1130 disposed over the substrate 1120. The substrate 1120 may include various materials having flexible characteristics. For example, the substrate 1120 may include a polymer resin, such as polyethersulphone (PES), polyacrylate (PAR), polyetherimide (PEI), polyethylene napthalate (PEN), polyethylene terephthalate polyphenylene sulfide (PPS), polyarylate, polyimide (PI), polycarbonate (PC), and/or cellulose acetate propionate (CAP).

A thin film transistor TFT, which is electrically connected to the organic light-emitting device 1130, may be disposed over the substrate 1120. The thin film transistor TFT may include a semiconductor layer 1122, a gate elect-rode 1124, a source electrode 1126S, and a drain electrode 1126D. The semiconductor layer 1122 may include amorphous silicon, polycrystalline silicon, and/or an organic semiconductor material. To electrically insulate the semiconductor layer 1122 and the gate electrode 1124 from each other, a gate insulating film 1123 may be disposed between the semiconductor layer 1122 and the gate electrode 1124. The gate insulating film 1123 may include an inorganic material, such as silicon oxide, silicon nitride, and/or silicon oxynitride. In addition, an interlayer insulating film 1125 may be disposed over the gate electrode 1124. The interlayer insulating film 1125 may include an inorganic material, such as silicon oxide, silicon nitride, and/or silicon oxynitride. The source electrode 1126S and the drain electrode 1126D may be disposed over the interlayer insulating film 1125. The interlayer insulating film 1125, including the inorganic material, may be formed, for example, by chemical vapor deposition (CVD) or atomic layer deposition (ALD).

A buffer layer 1121 may be disposed between the thin film transistor TFT and the substrate 1120. The buffer layer 1121 may include an inorganic material, such as silicon oxide, silicon nitride, and/or silicon oxynitride. The buffer layer 1121 may increase flatness of the top surface of the substrate 1120 (e.g., the buffer layer 1121 may be used to planarize imperfections in the top surface of the substrate), or may prevent or reduce the permeation of impurities from the substrate 1120, or the like, into the semiconductor layer 1122 of the thin film transistor TFT.

A planarization layer 1127 may be disposed over the thin film transistor ITT. For example, when the organic light-emitting device 1130 is arranged over the thin film transistor TFT, the planarization layer 1127 may substantially planarize the thin film transistor TFT. The planarization layer 1127 may include an organic material, such as acryl, polyimide, benzocyclobutene (BCB), and/or hexamethyldisiloxane (HMDSO). The planarization layer 1127 is illustrated in FIG. 2 as having a single-layered structure, but various modifications may be made thereto. For example, the planarization layer 1127 may have a multi-layered structure. The organic light-emitting device 1130 may be disposed over the planarization layer 1127. The organic light-emitting device 1130 may include a pixel electrode 1131, an opposite electrode 1135, and an intermediate layer 1133 disposed between the pixel electrode 1131 and the opposite electrode 1135. The intermediate layer 1133 may include an organic light-emitting layer. The pixel electrode 1131 may contact one of the source electrode 1126S and the drain electrode 1126D via an opening defined in the planarization layer 1127 and may be electrically connected to the thin film transistor TFT.

A pixel defining film 1129 may be disposed over the planarization layer 1127. The pixel defining film 1129 may define a pixel by including, an opening corresponding to each of a plurality of sub-pixels of the pixel. For example, an opening may expose a central portion of at least the pixel electrode 1131. In addition, the pixel defining film 1129 may increase a distance between an edge of the pixel electrode 1131 and the opposite electrode 1135 disposed over the pixel electrode 1131, thus preventing arcing at the edge of the pixel electrode 1131. The pixel defining film 1129 may include an organic material, such as polyimide (PI) and/or hexamethyldisiloxane (HMDSO).

The intermediate layer 1133 of the organic light-emitting device 1130 may include a low-molecular-weight material or a high-molecular-weight material. When the intermediate layer 1133 includes a low-molecular-weight material, the intermediate layer 1133 may have a single-layered structure or a multi-layered structure. The multi-layered structure may include, for example, a hole injection layer (HIL), a hole transport layer (HTL), an organic light-emitting layer (EML), an electron transport layer (ETL), and/or an electron injection layer (EIL). The intermediate layer 1133 may include various organic materials, such as copper phthalocyanine (CuPc), N,N'-di(naphthalene-1-yl)-N,N-diphenylbenzidine (NPB), and/or tris-8-hydroxyquinoline aluminum (Alq3). These layers may be formed, for example, by vacuum deposition.

When the intermediate layer 1133 includes a high-molecular-weight material, the intermediate layer 1133 may have a structure including art HTL and an EML. In this case, the HTL may include poly(3,4-ethylenedioxythiophene) (PEDOT) and the EML may include a poly-phenylenevinylene (PPV)-based polymer or a polyfluorene-based polymer. The intermediate layer 1133 may be formed by screen printing, inkjet printing, and/or laser induced thermal imaging (LITI).

The intermediate layer 1133 is not limited to the composition described above. The intermediate layer 1133 may have various different structures. For example, the intermediate layer 1133 may include an integrated layer throughout the plurality of pixel electrodes 1131, or may include layers patterned corresponding to the plurality of pixel electrodes 1131. The opposite electrode 1135 may be integrally formed with the plurality of organic light-emitting devices 1130 and the opposite electrode 1135 may correspond to the plurality of pixel electrodes 1131.

As the organic light-emitting device 1130 may be easily damaged by external moisture or oxygen, the display panel 1100 may further include an encapsulating layer 1140 that covers the organic light-emitting device 1130 so as to protect the organic light-emitting device 1130 from the external moisture, oxygen, or other potential contaminants. The encapsulating layer 1140 may include a first inorganic encapsulating layer 1141, an organic encapsulating layer 1142, and a second inorganic encapsulating layer 1143.

The first inorganic encapsulating layer 1141 may cover the opposite electrode 1135 and may include an inorganic material, such as silicon oxide, silicon nitride, and/or silicon oxynitride. In some exemplary embodiments of the present invention, other layers, such as a capping layer or a LiF layer, may be disposed between the first inorganic encapsulating layer 1141 and the opposite electrode 1135. Since the first inorganic encapsulating layer 1141 is provided along an understructure of the encapsulation layer, and over the plurality of light-emitting devices 1130, a top surface of the first inorganic encapsulating layer 1141 might not be as flat as is illustrated in FIG. 2. The organic encapsulating layer 1142 may cover the first inorganic encapsulating layer 1141. Unlike the first inorganic encapsulating layer 1141, a top surface of the organic encapsulating layer 1142 may be substantially flat. The organic encapsulating layer 1142 may include polyethylene terephthalate, polyethylene naphthalate, polycarbonate, polyimide, polyethylene sulfonate, polyoxymethylene, polyarylate, and/or hexamethyldisiloxane. The second inorganic encapsulating layer 1143 may cover the organic encapsulating layer 1142 and may include an inorganic material, such as silicon oxide, silicon nitride, and/or silicon oxynitride. The second inorganic, encapsulating layer 1143 may contact the first inorganic encapsulating layer 1141 at a corner of the display panel 1100, so as not to expose the organic encapsulating layer 1142 to the outside environment.

As described above, the encapsulating layer 1140 may include the first inorganic encapsulating layer 1141, the organic encapsulating layer 1142, and the second inorganic encapsulating layer 1143. Accordingly, even when cracks occur in the encapsulating layer 1140, the multi-layered structure of the encapsulating layer 1140 may prevent these cracks from propagating between the first inorganic encapsulating layer 1141 and the organic encapsulating layer 1142 or between the organic encapsulating layer 1142 and the second inorganic encapsulating layer 1143. Consequently, the organic light-emitting device 1130 may be protected from external moisture, oxygen, or other contaminants, even when cracks form in the encapsulating layer 1140.

The display panel 1100 may further include a protection film 1110 disposed below the substrate 1120. For example, the protection film 1110 may be disposed below a bottom surface of the substrate 1120 that is in an opposite direction (e.g. a −z direction) to a direction (e.g. a +z direction) in which the organic light-emitting device 1130 is disposed. The protection film 1110 may include polyethylene terephthalate (PET) and/or polyimide (PI). The protection film 1110 may be attached to the bottom surface of the substrate 1120, for example, by an adhesion layer. The adhesion layer may include a pressure sensitive adhesive (PSA). The time to attach the protection film 1110 to the bottom surface of the substrate 1120 may change depending on situations.

For example, when multiple display devices are formed over a single mother substrate having flexible or bendable characteristics, a hard carrier substrate may be disposed below the mother substrate so as to facilitate handling of the mother substrate during a manufacturing process of the display devices. In a state in which the mother substrate is supported by the carrier substrate, a circuitry including the thin film transistor TEL the plurality of organic light-emitting devices 1130, and the encapsulating layer 1140 that encapsulates the organic light-emitting devices 1130 may be formed over the mother substrate. After the multiple organic light-emitting devices 1130 are formed over the mother substrate, the carrier substrate may be separated from the mother substrate. According to some exemplary embodiments of the present invention, after a touch electrode and/or a touch protection layer that protects the touch electrode are/is formed over the encapsulating layer 1140, the carrier substrate may be separated from the mother substrate. In either case, the protection film 1110 may be attached to the surface of the mother substrate that faces the carrier substrate after the carrier substrate is separated from the mother substrate. Accordingly, a plurality of display panels 1100 may be obtained by cutting the mother substrate and the protection film 1110. The substrate 1120 shown in FIG. 2, and elsewhere within the figures and disclosure, may accordingly be understood as being the cut mother substrate.

After the plurality of display panels 1100 are obtained by cutting the mother substrate and the protection film 1110, the optical film 150 may be attached to the encapsulating layer 1140, for example, by an optically clear adhesive (OCA). If a touch electrode or a touch protection layer is present over the encapsulating layer 1140, the OCA and the optical film 150 may be disposed over these components.

Alternatively, only a single display device may be formed over only a single substrate 1120, rather than simultaneously manufacturing the plurality of display panels 1100 by using the mother substrate. Even when only a single display device is formed over only a single substrate 1120, a hard carrier substrate may be disposed below the substrate 1120, the hard carrier substrate having either flexible or bendable characteristics so as to facilitate handling of the substrate 1120 during a manufacturing process. After the display component, such as the organic light-emitting device 1130, the circuitry including the thin film transistor TFT, and the encapsulating layer 1140 that encapsulates the same, are formed over the substrate 1120, the carrier substrate may be separated from the substrate 1120. In some exemplary embodiments of the present invention, the carrier substrate may be separated from the mother substrate after a touch electrode and/or a touch protection layer that protects the touch electrode are/is formed over the encapsulating layer 1140.

In either case, after the carrier substrate is separated from the mother substrate, the protection film 1110 may be attached to the surface of the substrate 1120 that faces the carrier substrate. After that, the optical film 150 may be attached to the encapsulating layer 1140 or the touch protection layer by an OCA. In some exemplary embodiments of the present invention, a printed circuit board or an electronic microchip may be attached to a corner of the display panel 1100.

Referring to FIGS. 3 and 4, the optical film 150, which prevents reflection of external light, may include a circular polarizer CP including a quarter wave ($\lambda/4$) phase retarder 151, a half wave ($\lambda/2$) phase retarder 153, and a polarizer 155, which may be sequentially disposed over the display panel 1100. The optical film 150 may additionally include a protection member 157 that is disposed over the circular polarizer CP and supports and protects the circular polarizer CP. Adhesion layers 152 and 154 may be disposed between the $\lambda/4$ phase retarder 151 and the $\lambda/2$ phase retarder 153 and between the $\lambda/2$ phase retarder 153 and the polarizer 155, respectively. Adhesion layers 152 and 154 may include first adhesion layer 152 disposed between the $\lambda/4$ phase retarder 151 and the $\lambda/2$ phase retarder 153 and second adhesion layer 154 disposed between the $\lambda/2$ phase retarder 153 and the polarizer 155. For example, the adhesion layers 152 and 154 may be acryl-based gluing agents, polyvinyl alcohol-based adhesives or the like. The protection member 157 may be a cyclo-olefin polymer (COP) film, a tri-acetyl cellulose (TAC) film, and/or an acrylic film. An adhesion layer 156 may be disposed between the polarizer 155 and the protection member 157. The adhesion layer 156 may a water-based adhesive or an ultraviolet (UV) curing adhesive. The adhesion layers 152 and 154 may be optionally omitted according to a method of forming the λ/4 phase retarder 151, the λ/2 phase retarder 153, and the polarizer 155.

According to an exemplary embodiment of the present invention, the λ/4 phase retarder 151 and the λ/2 phase retarder 153 may each be coating-type phase retarders. For example, the λ/4 phase retarder 151 and the λ/2 phase retarder 153 may include reactive liquid crystals. The reactive liquid crystals may be, for example, discotic liquid crystals or nematic liquid crystals. In the flexible display apparatus, a thickness of the optical film 150 may be minimized so as to facilitate the bending or folding of the flexible display apparatus. Accordingly, the λ/4 phase retarder 151 and the λ/2 phase retarder 153 may be implemented by coating-type phase retarders that are thinner than film-type phase retarders. Each of the λ/4 phase retarder 151 and the λ/2 phase retarder 153 may further include an alignment film to align the reactive liquid crystals. The λ/4 phase retarder 151 may be disposed in the lowermost layer of the optical film 150. The λ/4 phase retarder 151 may include nematic liquid crystals so as to increase durability against stress. However, embodiments of the present invention are not limited to this approach. For example, the types of the liquid crystals included in the λ/4 phase retarder 151 and the λ/2 phase retarder 153 are not particularly limited to the types listed above, and the λ/4 phase retarder 151 and the λ/2 phase retarder 153 may be implemented by film-type phase retarders, instead of the coating type phase retarders.

The polarizer 155 may be polyvinyl acetate (PVA) stretched in a certain direction. The λ/4 phase retarder 151 and the λ/2 phase retarder 153 may each be a normal dispersion phase retarder or inverse dispersion phase retarder.

When the circular polarizer includes only the λ/4 phase retarder 151 and the polarizer 155 and an angle between the slow axis of the λ/4 phase retarder 151 and the absorption axis of the polarizer 155 is 45 substantially degrees, external light, which is incident onto the optical film 150, may be polarized in a certain direction while passing through the polarizer 155. The polarized light may be circularly polarized while passing through the λ/4 phase retarder 151. The circularly polarized light may be reflected by a metal layer or the like included in the pixel electrode 1131, the opposite electrode 1135, or the thin film transistor TFT of the display panel 1100, and may be incident again onto the optical film 150.

When the light is reflected by the metal layer or the like, clockwise circularly polarized light may be changed to counterclockwise circularly polarized light, and counterclockwise circularly polarized light may be changed to clockwise circularly polarized light. The light, of which the rotating direction is changed, may be polarized again in a certain direction while passing through the λ/4 phase retarder 151. However, a polarization direction of the light passing through the λ/4 phase retarder 151, after the reflection, may be changed by about 90 degrees, as compared with a polarization direction of the light incident onto the λ/4 phase retarder 151 before the reflection. Therefore, the light passing through the λ/4 phase retarder 151, after the reflection, does not pass through the polarizer 155. Since the incident external light is not emitted back out to the outside of the display apparatus, the incident external light is not seen as glare, and accordingly, visibility and contrast of the display apparatus is increased.

A phase retardation value of the λ/4 phase retarder 151 may be dependent an a wavelength of light traveling therethrough. When the circular polarizer is implemented by only the λ/4 phase retarder 151 and the polarizer 155, anti-reflection performance of the display apparatus may be degraded according to a wavelength or an angle at which the user views the display apparatus. In addition, when the display apparatus is a bendable or foldable display apparatus, the direction of the slow axis of the λ/4 phase retarder 151 may be changed by a tensile force generated during bending or folding. Hence, anti-reflection performance of the display apparatus may be degraded, and a color of an image produced by the display apparatus may be changed to an unintended color.

According to an exemplary embodiment of the present invention, the optical film 150 included in the display apparatus may include at least two phase retarders 151 and 153 and one polarizer 155. For example, the optical film ISO may include the λ/4 phase retarder 151, the λ/2 phase retarder 153, and the polarizer 155, which are sequentially disposed over the display panel 1100. The λ/2 phase retarder 153 may serve to change only the polarization direction of the polarized light. By appropriately setting an angle between the slow axes of the λ/4 phase retarder 151 and the λ/2 phase retarder 153 and the absorption axis of the polarizer 155, it is possible to perform an anti-reflection function on the same principle as that of the circular polarizer that includes only the λ/4 phase retarder 151 and the polarizer 155, and to minimize a change in the anti-reflection performance of the display apparatus even as an angle at which the user views the display apparatus changes.

When the display apparatus is a bendable or a foldable display apparatus, an angle between the slow axis of the λ/4 phase retarder 151 and the slow axis of the λ/2 phase retarder 153 may be changed by a tensile force generated during bending or folding. Hence, anti-reflection performance of the display apparatus may be degraded, and a color of an image produced by the display apparatus may be changed to an unintended color.

According to an exemplary embodiment of the present invention, the optical film 150 may include at least two phase retarders 151 and 153 as described above, and the slow axes of the at least two phase retarders 151 and 153 may be disposed within the same quadrants of the optical film 150. As shown in FIG. 4, the four quadrants of the optical film may include QR1, QR2, QR3, and QR4. These four quadrants are delineated by the folding axis FA, which extends in a first direction (e.g. x-axis) and a virtual axis VA that extends in a second direction (e.g. y-axis) that is perpendicular to the first direction (e.g. x-axis). The folding axis FA and the virtual axis VA intersect each other at a center of the optical film 150. An intersection point of the folding axis FA and the virtual axis VA may be used as a reference point. In the present specification, it may be assumed that the slow axes of the phase retarders 151 and 153 pass through the reference point.

Referring to FIG. 4, a slow axis 151SA of the λ/4 phase retarder 151 and a slow axis 153SA of the λ/2 phase retarder 153 may both be disposed in both the first quadrant QR1 and the third quadrant QR3. The slow axis 151SA of the λ/4 phase retarder 151 and the slow axis 153SA of the λ/2 phase retarder 153 may form an angle ($\theta_1$-$\theta_2$) of about 55 degrees to about 65 degrees with respect to each other. For example, the slow axis 151SA of the λ/4 phase retarder 151 and the folding axis FA may form an angle $\theta_1$ of about 62.5 degrees to about 72.5 degrees with respect to each other, and the slow axis 153SA of the λ/2 phase retarder 153 and the folding axis FA may form an angle $\theta_2$ of about 5 degrees to about 10 degrees with respect to each other. Each of the angles $\theta_1$ and $\theta_2$ is understood to be an angle increasing counterclockwise with respect to the folding axis FA. A case where both the slow axes 151SA and 153SA of the λ/4 phase retarder 151 and the λ/2 phase retarder 153 are greater than 0 degree and less than 90 degrees may mean that the slow axes 151SA and 153SA of the λ/4 phase retarder 151 and the λ/2 phase retarder 153 are all in the first quadrant QR1.

According to an exemplary embodiment of the present invention, an absorption axis 155AA of the polarizer 155 may be within both the first quadrant QR1 and the third quadrant QR3, and the absorption axis 155AA of the polarizer 155 and the folding axis FA may form an angle $\theta_3$ of about 75 degrees to about 85 degrees with respect to each other. The absorption axis 155AA of the polarizer 155 and the slow axis 151SA of the λ/4 phase retarder 151 may form an angle ($\theta_1$-$\theta_1$) of about 7.5 degrees to about 17.5 degrees with respect to each other.

As described above, by arranging the slow axes of the λ/4 and λ/2 phase retarders 151 and 153 of the optical film 150 to be in the same quadrant, the same tensile force or similar tensile forces may be applied to the λ/4 and λ/2 phase retarders 151 and 153 when the display apparatus is bended or folded about the folding axis FA. Therefore, a change in the angles of the slow axes of the λ/4 and λ/2 phase retarders 151 and 153 due to the tensile force occurs in substantially the same direction, thus minimizing a change in the angle between the λ/4 and λ/2 phase retarders 151 and 153. For example, even when the tensile force increases and thus the change in the angles of the slow axes of the λ/4 and λ/2 phase retarders 151 and 153 increases, an angle variation may be offset from each other because the change in the angles of the slow axes of the λ/4 and λ/2 phase retarders 151 and 153 occurs in substantially the same direction. Consequently, a color of an image produced by the image apparatus might be prevented from changing to an unintended color, or an extent to which the color is changed may be reduced, by the change in the angles of the slow axes of the λ/4 and λ/2 phase retarders 151 and 153.

Figure 5:
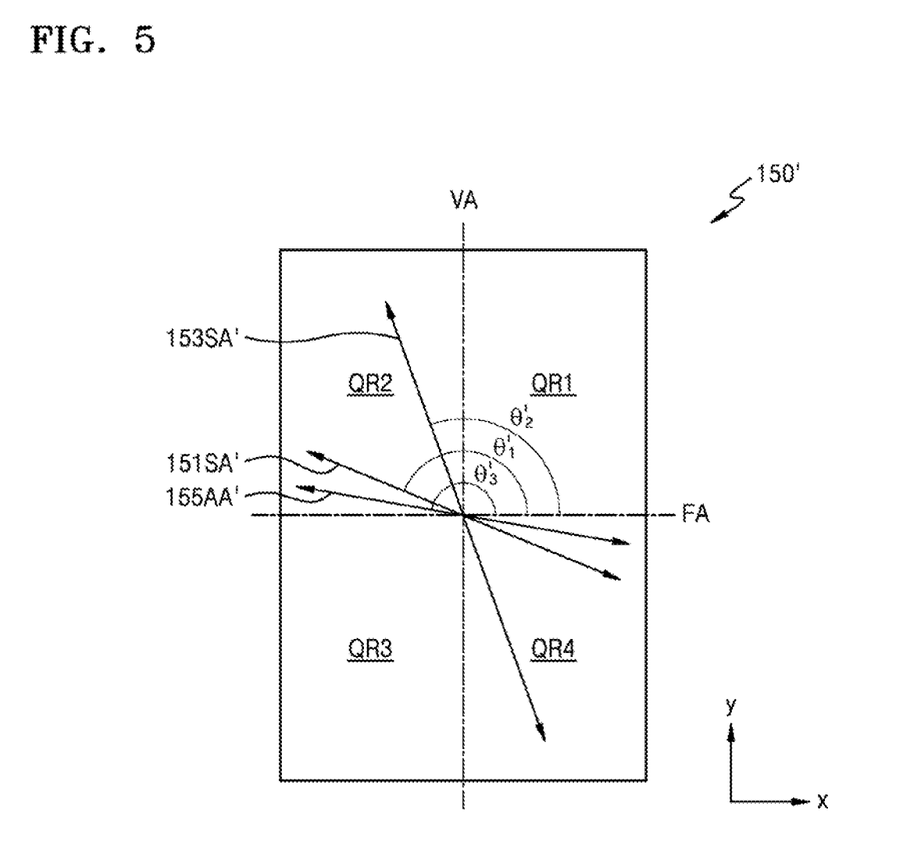
FIGS. 5 to 7 are conceptual diagrams of slow axes of phase retarders and an absorption axis of a polarizer in an optical film according to various exemplary embodiments of the present invention.
Figure 6:
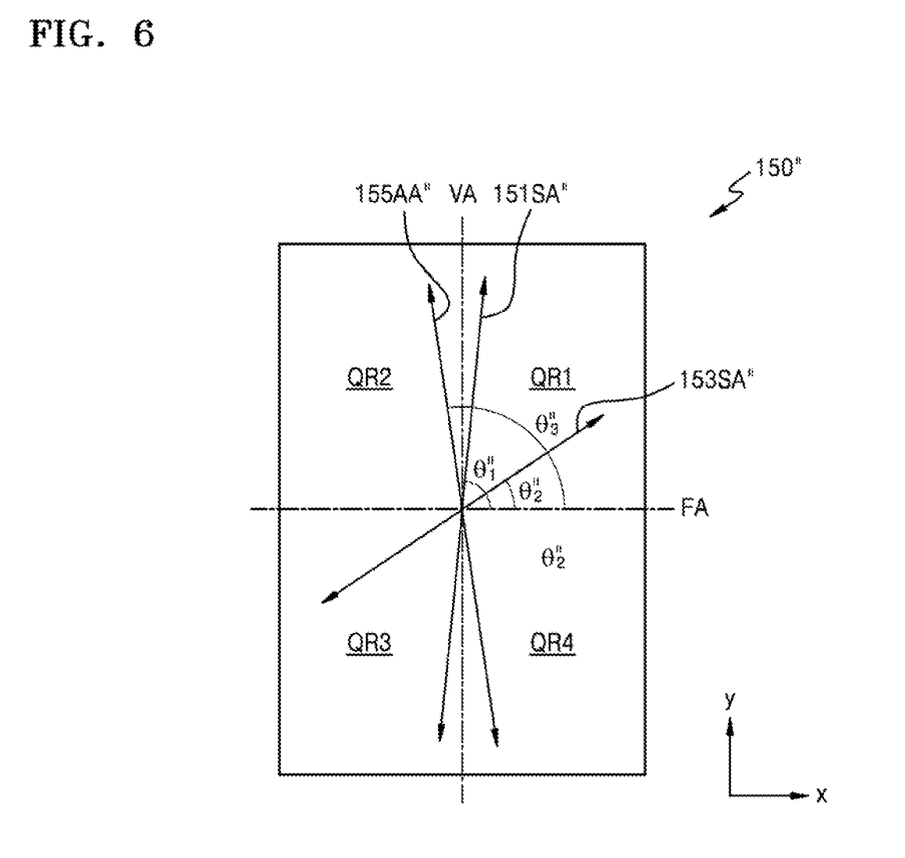
Figure 7:
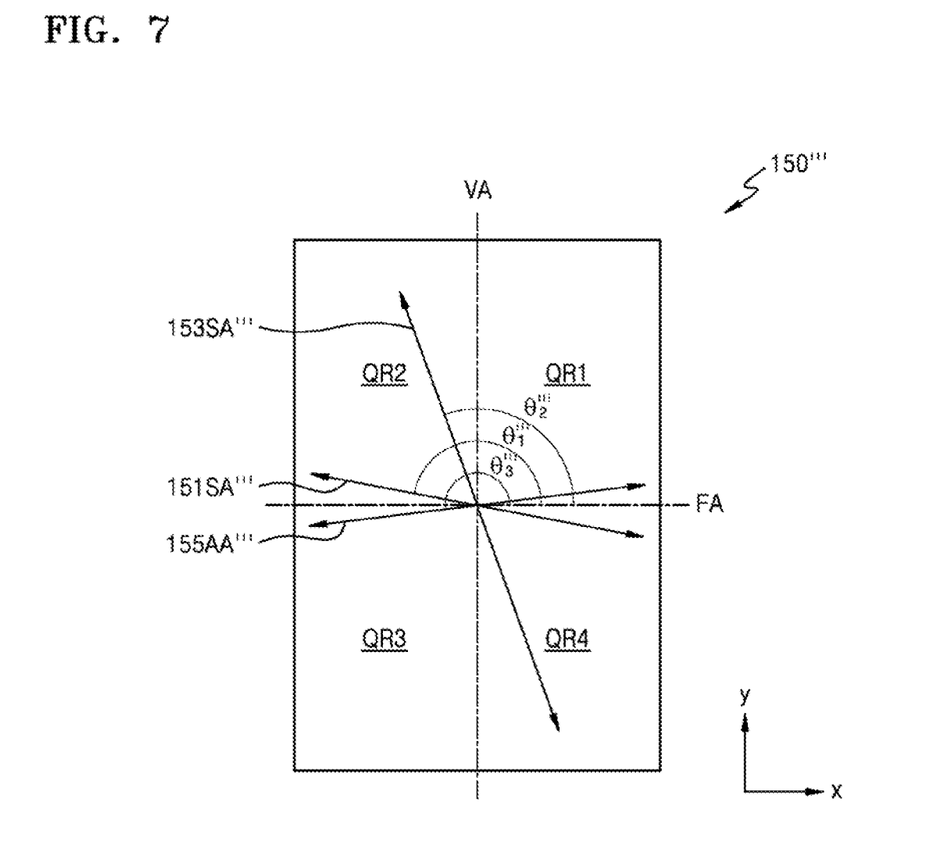

FIGS. 5 to 7 are conceptual diagrams of optical axes of phase retarders and an absorption axis of a polarizer in optical films 150', 150", and 150'" according to various exemplary embodiments of the present invention.

Referring to FIG. 5, the optical film 150', according to an exemplary embodiment of the present invention, may include the λ/4 phase retarder 151, the λ/2 phase retarder 153, and the polarizer 155, which are sequentially disposed over the display panel, as illustrated in FIG. 3. According to an exemplary embodiment of the present invention, a slow axis 151SA' of the λ/4 phase retarder 151 and a slow axis 153SA' of the λ/2 phase retarder 153 may both be fully located within the second quadrant QR2 and the fourth quadrant QR4, and the slow axis 151SA' of the λ/4 phase retarder 151 and the slow axis 153SA' of the λ/2 phase retarder 153 may form an angle ($\theta_1$'-$\theta_2$') of about 55 degrees to about 65 degrees with respect to each other. For example, the slow axis 151SA' of the λ/4 phase retarder 151 and the folding axis FA may form an angle $\theta_1$' of about 152.5 degrees to about 162.5 degrees with respect to each other, and the slow axis 153SA' of the λ/2 phase retarder 153 and the folding axis FA may form an angle $\theta_2$' of about 92.5 degrees to about 102.5 degrees with respect to each other. For example, both the slow axes 151SA' and 153SA' of the λ/4 phase retarder 151 and the λ/2 phase retarder 153 may be greater than 90 degrees and less than 180 degrees.

According to an exemplary embodiment of the present invention, an absorption axis 155AA' of the polarizer 155 may be fully located within the second quadrant QR2 and the fourth quadrant QR4, and the absorption axis 155AA' of the polarizer 155 and the folding axis FA may form an angle $\theta_3$' of about 165 degrees to 175 degrees with respect to each other. The absorption axis 155AA' of the polarizer 155 and the slow axis 155SA' of the λ/4 phase retarder 151 may form an angle ($\theta_3$'-$\theta_1$') of about 7.5 degrees to about 17.5 degrees with respect to each other.

Referring to FIG. 6, the optical film 150" according to an exemplary embodiment of the present invention may include the λ/4 phase retarder 151, the λ/2 phase retarder 153, and the polarizer 155, which are sequentially disposed over the display panel, as illustrated in FIG. 3. According to an exemplary embodiment of the present invention, a slow axis 151SA" of the λ/4 phase retarder 151 and a slow axis 153SA" of the λ/2 phase retarder 153 may both be fully within the first quadrant QR1 and the third quadrant QR3, and the slow axis 151SA" of the λ/4 phase retarder 151 and the slow axis 153SA" of the λ/2 phase retarder 153 may form an angle ($\theta_1$"-$\theta_2$") of about 55 degrees to about 65 degrees with respect to each other. According to an exemplary embodiment of the present invention, unlike the slow axes 151SA" and 153SA" of the λ/4 phase retarder 151 and the λ/2 phase retarder 153, an absorption axis 155AA" of the polarizer 155 may be entirely within the second quadrant QR2 and the fourth quadrant QR4, and the absorption axis 155AA" of the polarizer 155 and the slow axis 151SA" of the λ/4 phase retarder 151 may form an angle ($\theta_3$"-$\theta_1$") of about 7.5 degrees to about 17.5 degrees with respect to each other.

Referring to FIG. 7, the optical film 150'" according to an exemplary embodiment of the present invention may include the λ/4 phase retarder 151, the λ/2 phase retarder 153, and the polarizer 155, which are sequentially disposed over the display panel, as illustrated in FIG. 3. According to an exemplary embodiment of the present invention, a slow axis 151SA" of the λ/4 phase retarder 151 and a slow axis 153SA" of the λ/2 phase retarder 153 may both be entirely within the second quadrant QR2 and the fourth quadrant QR4, and the slow axis 151SA" of the λ/4 phase retarder 151 and the slow axis 153SA'" of the λ/2 phase retarder 153 may form an angle ($\theta_1$'"-$\theta_2$'") of about 55 degrees to about 65 degrees with respect to each other. According to an exemplary embodiment of the present invention, unlike the slow axes 151SA" and 153SA' of the λ/4 phase retarder 151 and the λ/2 phase retarder 153, an absorption axis 155AA'" of the polarizer 155 may be located entirely within the first quadrant QR1 and the third quadrant QR3, and the absorption axis 154AA'" of the polarizer 155 and the slow axis 151A' of the λ/4 phase retarder 151 may form an angle ($\theta_3$'"-$\theta_1$'") of about 7.5 degrees to about 17.5 degrees with respect to each other.

FIGS. 4 to 7 illustrate the slow axes of the λ/4 phase retarders 151, the slow axes of the λ/2 phase retarders 153, and the angles between the absorption axes of the polarizers 155 and the folding axis FA in the optical films 150, 150', 150", and 150'" according to some exemplary embodiments of the present invention. However, the invention is not limited to the exemplary embodiments described herein. The angle between the slow axes of the phase retarders, the angle between the absorption axis of the polarizer and the folding axis FA, and the angle between the absorption axis of the polarizer and the slow axes of the phase retarders may have various different values, as long as slow axes of at least two phase retarders included in the optical films 150, 150', 150", and 150'" are in the same quadrant and the optical films 150, 150', 150", and 150'" perform the anti-reflection function.

Figure 8:
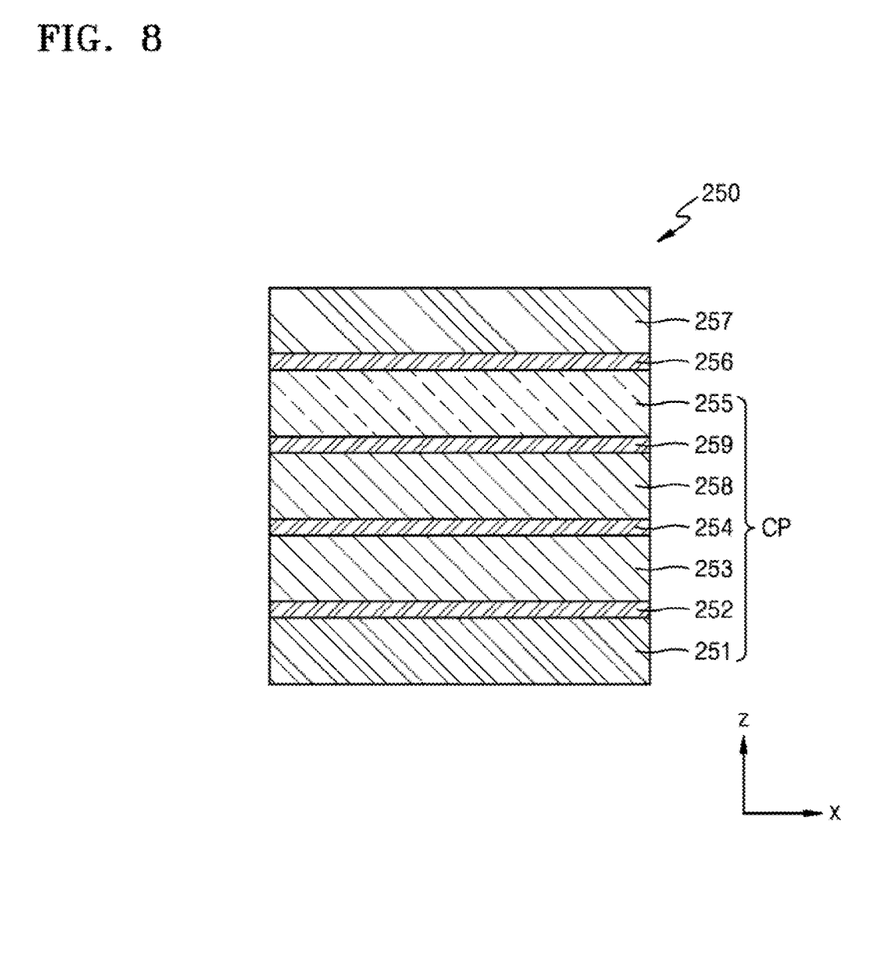
FIG. 8 is a schematic cross-sectional view of an optical film according to an exemplary embodiment of the present invention.

FIG. 8 is a schematic cross-sectional view of an optical film 250 according to an exemplary embodiment of the present invention.

Referring to FIG. 8, the optical film 250 according to an exemplary embodiment of the present invention, may prevent reflection of external light and may include a circular polarizer CP including a λ/4 phase retarder 251, a λ/2 phase retarder 253, an additional λ/2 phase retarder 258, and a polarizer 255, which are sequentially disposed over the display panel (1100 in FIG. 1). The optical film 250 may further include a protection member 257 that is disposed over the circular polarizer CP and supports and protects the circular polarizer CP. Adhesion layers 252, 254, and 259 may be disposed between the λ/4 phase retarder 251 and the λ/2 phase retarder 253, between the λ/2 phase retarder 253 and the additional λ/2 phase retarder 258, and between the additional λ/2 phase retarder 258 and the polarizer 255, respectively. For example, the adhesion layers 252, 254, and 259 may be acryl-based gluing agents, polyvinyl alcohol-based adhesives or the like. The protection member 257 may include a COP film, a TAC film, and/or an acrylic film. An adhesion layer 256 may also be disposed between the polarizer 255 and the protection member 257. The adhesion layer 256 may include a water-based adhesive or a UV-curing adhesive. The adhesion layers 252, 254, and 259 may be omitted according to some methods of forming the phase retarders 251, 253, and 258 and the polarizer 255.

FIG. 8 illustrates a case where one additional λ/2 phase retarder 258 is included in the optical film 250. However, exemplary embodiments of the present invention are not limited to the use of this particular number of λ/2 phase retarders. For example, two or more additional λ/2 phase retarders 258 may be included in the optical film 250. The optical film 250 may further include an additional λ/4 phase retarder. The slow axes of the phase retarders 251, 253, and 258 may all be in the same quadrant, or within the same two quadrants. According to such a configuration, even when the directions of the slow axes of the phase retarders 251, 253, and 258 are changed due to the tensile force generated during the bending or folding the display apparatus, the slow axes of the phase retarders 251, 253, and 258 are changed in substantially the same direction, thus offsetting the amount of change and minimizing or preventing perceivable color shift.

Figure 9:
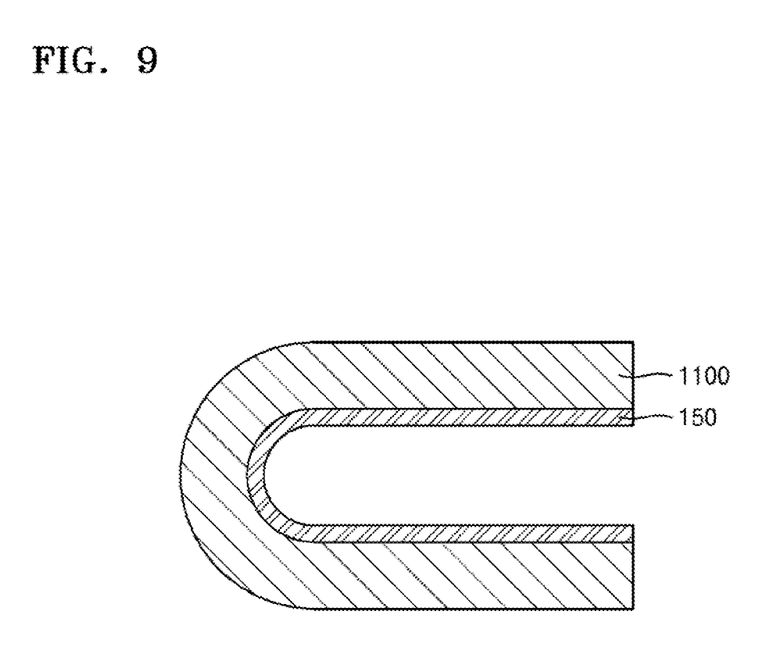
FIGS. 9 and 10 are schematic cross-sectional views illustrating display apparatuses according to exemplary embodiments of the present invention.
Figure 10:
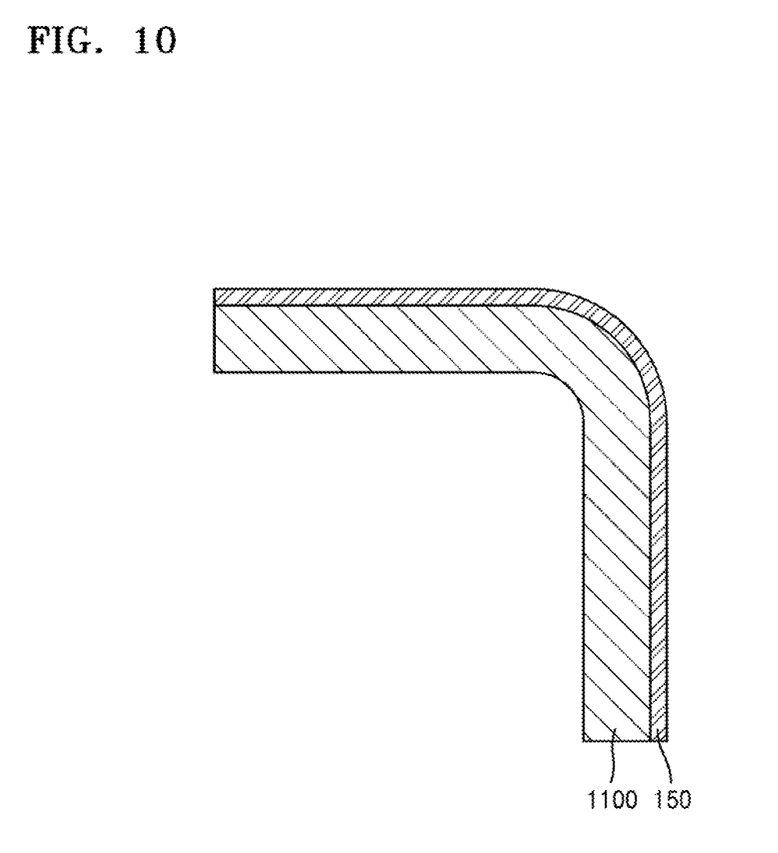

FIGS. 9 and 10 are schematic cross-sectional views illustrating display apparatuses according to exemplary embodiments of the present invention.

Referring to FIG. 9, the display apparatus according to an exemplary embodiment of the present invention may include a display panel 1100 and an optical film 150. The display panel 1100 may display an image and may have a folding axis about which the display panel 1100 may be folded. The optical film 150 may be disposed over the display panel 1100. Unlike the display apparatuses discussed above and illustrated in FIG. 1 and FIG. 10, here, when the display apparatus is folded, the optical film 150 may be disposed on an inward side, with respect to the folding.

In this case, a compressive force, rather than a tensile force, may be generated in the optical film 150 during the folding of the display apparatus. The compressive force may change directions of slow axes of phase retarders included in the optical film 150. However, since slow axes of at least two phase retarders included in the optical film 150 are all in the same quadrant, or within the same two quadrants, it is possible to offset the change in the slow axes of the phase retarders due to the compressive force and minimizing or preventing perceivable color shift.

The folding angles are not limited to those illustrated in FIGS. 1 and 9. According to some exemplary embodiments of the present invention, the display apparatus may have various folding angles, for example, the display apparatus may be folded into a right angle (about 90 degrees), as illustrated in FIG. 10, or may be folded flat upon itself (about 180 degrees). In either case, the display apparatus may be folded about the folding axis FA.

As described above, since the slow axes of the phase retarders 151, 153, 251, 253, and 258 of the optical films 150, 150', 150'', 150''', and 250 are in the same quadrant, or are in the same two quadrants, it is possible to offset the change in the angles of the slow axes of the phase retarders 151, 153, 251, 253, and 258 when the display apparatus is bended or folded. Consequently, it is possible to prevent or reduce unintended color shifting resulting from the change in the angles of the slow axes of the phase retarders 151, 153, 251, 253, and 258 caused by the bending of the display apparatus.

While multiple exemplary embodiments of the present invention have been described herein with reference to the figures, it will be understood by those of ordinary skill in the art that various changes in form and details may be made therein without departing from the spirit and scope of the disclosure.

What is claimed is:

1. A display apparatus comprising:
   a display panel configured to display an image, the display panel including a folding axis extending in a first direction; and
   an optical film disposed over the display panel, the optical film comprising a circular polarizer comprising at least two phase retarders and one polarizer, wherein each of the at least two phase retarders has a slow axis and a fast axis,
   wherein the optical film is delineated into four quadrants by the folding axis and a virtual axis extending in a second direction perpendicular to the first direction, and
   wherein slow axes of each of the at least two phase retarders are located in a same quadrant of the four quadrants of the optical film.

2. The display apparatus of claim 1, wherein the at least two phase retarders comprise a quarter wave (λ/4) phase retarder and a half wave (λ/2) phase retarder.

3. The display apparatus of claim 2, wherein the circular polarizer comprises the λ/4 phase retarder, the λ/2 phase retarder, and the polarizer, which are sequentially disposed over the display panel.

4. The display apparatus of claim 3, wherein the slow axis of the λ/4 phase retarder and the slow axis of the λ/2 phase retarder form an angle of about 55 degrees to about 65 degrees with respect to each other.

5. The display apparatus of claim 2, wherein the λ/4 phase retarder and the λ/2 phase retarder each comprise reactive liquid crystals.

6. The display apparatus of claim 5, wherein the λ/4 phase retarder comprises nematic liquid crystals, and the λ/2 phase retarder comprises discotic or nematic liquid crystals.

7. The display apparatus of claim 1, wherein an absorption axis of the polarizer is located in a same quadrant, of the four quadrants, as the slow axes of each of the at least two phase retarders.

8. The display apparatus of claim 1, wherein, the display panel comprises:
   a flexible substrate; and
   an organic light-emitting device disposed over the flexible substrate, the organic light-emitting device comprising a pixel electrode, an opposite electrode, and an intermediate layer disposed between the pixel electrode and the opposite electrode, wherein the intermediate layer includes an organic light-emitting layer.

9. The display apparatus of claim 8, wherein the display panel further comprises:

a protection film disposed below the flexible substrate; and an encapsulating layer disposed over the flexible substrate and covering the organic light-emitting device, the encapsulating layer comprising at least one inorganic encapsulating layer and at least one organic encapsulating layer.

10. The display apparatus of claim 2, wherein a slow axis of the λ/4 phase retarder and the folding axis form a first angle of about 62.5 degrees to about 72.5 degrees with respect to each other, a slow axis of the λ/2 phase retarder and the folding axis form a second angle of about 2.5 degrees to about 12.5 degrees with respect to each other, and each of the first and second angles is measured counterclockwise with respect to the folding axis.

11. The display apparatus of claim 10, wherein an absorption axis of the polarizer and the folding axis form a third angle of about 75 degrees to about 85 degrees with respect to each other.

12. The display apparatus of claim 2, wherein a slow axis of the λ/4 phase retarder and the folding axis form a first angle of about 152.5 degrees to about 162.5 degrees with respect to each other, a slow axis of the λ/2 phase retarder and the folding axis form a second angle of about 92.5 degrees to about 102.5 degrees with respect to each other, and each of the first and second angles is measured counterclockwise with respect to the folding axis.

13. The display apparatus of claim 12, wherein an absorption axis of the polarizer and the folding axis form a third angle of about 165 degrees to about 175 degrees with respect to each other.

14. The display apparatus of claim 3, wherein the optical film further comprises:

a first adhesion layer disposed between the λ/4 phase retarder and the λ/2 phase retarder; and a second adhesion layer disposed between the λ/2 phase retarder and the polarizer.

15. The display apparatus of claim 2, wherein the at least two phase retarders further comprise an additional half wave (λ/2) phase retarder.

16. A flexible display apparatus, comprising:

a flexible display panel; and an optical film disposed on the flexible display panel, the optical film comprising a first phase retarder and a second phase retarder, wherein each of the first phase retarder and the second phase retarder has a slow axis and a fast axis, wherein a slow axis of the first phase retarder is aligned with a slow axis of the second phase retarder.

17. The flexible display apparatus of claim 16, wherein alignment of the slow axis of the second phase retarder with the slow axis of the first phase retarder includes disposing the second phase retarder such that an angle between the slow axis of the first phase retarder and the slow axis of the second phase retarder is within a range of between 55 and 65 degrees.

18. The flexible display apparatus of claim 16, wherein alignment of the slow axis of the second phase retarder with the slow axis of the first phase retarder includes disposing the second phase retarder such that the slow axis of the first phase retarder and the slow axis of the second phase retarder are located within a same quadrant of four quadrants of the optical film that are defined by a folding axis of the optical film and a perpendicular axis that is perpendicular to the folding axis.

19. The flexible display apparatus of claim 16, wherein the first phase retarder is a half wave phase retarder, the second phase retarder is a quarter wave phase retarder, and the optical film additionally comprises a polarizer.

20. The flexible display apparatus of claim 16, wherein alignment of the slow axis of the second phase retarder with the slow axis of the first phase retarder includes disposing the second phase retarder such that as the flexible display apparatus bends, a disposition of the slow axis of the first phase retarder relative to a disposition of the slow axis of the second phase retarder remains unchanged.

* * * * *